(12) United States Patent
Shimizu et al.

(10) Patent No.: US 7,025,906 B2
(45) Date of Patent: Apr. 11, 2006

(54) CONDUCTIVE PARTICLES, CONDUCTIVE COMPOSITION, ELECTRONIC DEVICE, AND ELECTRONIC DEVICE MANUFACTURING METHOD

(75) Inventors: Kozo Shimizu, Kawasaki (JP); Yasuo Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 10/087,913

(22) Filed: Mar. 5, 2002

(65) Prior Publication Data

US 2002/0175316 A1    Nov. 28, 2002

(30) Foreign Application Priority Data

Mar. 6, 2001    (JP) .............................. 2001-061326

(51) Int. Cl.
*H01B 1/22* (2006.01)

(52) U.S. Cl. ..................... 252/512; 252/518.1; 428/403

(58) Field of Classification Search ................ 252/512, 252/518.1; 428/403
See application file for complete search history.

(56) References Cited

U.S. PATENT DOCUMENTS 5,601,228 A * 2/1997 Fukunaga et al. ..... 228/180.21
5,674,326 A * 10/1997 Wrezel et al. ................. 148/24
5,962,133 A * 10/1999 Yamaguchi et al. ......... 428/403
6,334,905 B1 * 1/2002 Hanawa et al. ................ 148/23

FOREIGN PATENT DOCUMENTS

| EP | 0 708 582 A1 | 4/1996 |
|---|---|---|
| JP | 61-195941 | * 8/1986 |
| JP | 5-96396 | * 4/1993 |
| JP | 7-179832 | 7/1995 |
| JP | 10-265748 | 10/1998 |

* cited by examiner

*Primary Examiner*—Mark Kopec
(74) *Attorney, Agent, or Firm*—Armstrong, Kratz, Quntos, Hanson & Brooks, LLP (57) ABSTRACT

A conductive composition layer, conductive particles as a raw material, a conductive composition therefor, a manufacturing method of the conductive composition layer, etc. are provided wherewith heat conductance can be accelerated between electronic devices or electronic devices can be electrically connected. The conductive composition layer is formed by subjecting to heat treatment at a temperature lower than 230° C. a conductive composition comprising conductive particles having a metal base material and a metal coating material thereon as well as a thermosetting resin having a curing temperature that is lower than 230° C. and/or a thermoplastic resin having a melting point that is lower than 230° C.

7 Claims, 4 Drawing Sheets

FIG. 1

PRIOR ART

CONDUCTIVE PARTICLES, CONDUCTIVE COMPOSITION, ELECTRONIC DEVICE, AND ELECTRONIC DEVICE MANUFACTURING METHOD

BACKGROUND OF THE INVENTION

1. Field of the Invention

This invention relates to a thermally conductive composition layer of high thermal conductivity, thermally conductive particles and a thermally conductive composition that can be used in forming such a layer, an electronic device having that thermally conductive composition layer between layers thereof, and a method of forming the thermally conductive composition layer. The present invention relates mainly to cases where adhesiveness is required.

More particularly, the present invention relates to a thermally conductive composition layer exhibiting high thermal conductivity and to raw material therefor, used in cases where such are employed as an adhesive layer between heat generating bodies such as electronic components including semiconductor devices as well as mounting boards and heat radiating bodies or other components, to electronic components for which such are employed, and to a formation method therefor.

Because it is an invention wherewith such thermal conductivity can be achieved by the presence of a metal or alloy, the fact that outstanding thermal conductivity is exhibited can also mean that electrical conductivity is excellent in the present invention. Accordingly, the present invention relates also to an electrically conductive composition layer of high electrical conductivity, electrically conductive particles and an electrically conductive composition that can be used in forming such a layer, an electronic device having that electrically conductive composition layer between layers thereof, and a method of forming the electrically conductive composition layer.

In other words, in the specification of this application, the term "conductivity" comprehends both "thermal conductivity" and "electrical conductivity."

2. Description of the Related Art

In electronic devices such as semiconductor devices of recent years, advances are being made in achieving increasingly high-density mounting and higher integration, and ever higher speeds are being sought.

In conjunction with this trend, the amount of heat generated when driving electronic components is tending to increase, and there is a danger of causing electronic component performance to decline unless cooling is done efficiently.

One method that is used for cooling electronic components is a method of joining heat sinks and the like by die bonding to semiconductor devices or to circuit boards whereon such electronic components are mounted. When that is done, in order to improve cooling efficiency, improving the performance of the heat sink is of course necessary, but it is also necessary to enhance the thermal conductivity of the bonding materials used in joining the electronic components and the heat sink or other cooling components. For that reason, techniques are adopted for improving cooling efficiency by using bonding materials of high thermal conductivity between a heat sink and an electronic component or the like. More specifically, thermal conductivity is imparted by mixing a filler powder of high thermal conductivity suitably into an epoxy resin, silicone resin, or the like, so that cooling efficiency is improved by using that material to bond the heat sink or the like to an electronic component such as an LSI device.

Furthermore, since, in an LSI device package such as a CSP, copper or some other heat spreader is joined by die bonding to the LSI device by means of an adhesive such as a silicone resin, materials of high thermal conductivity are also wanted for the bonding material.

To date, for such materials, inorganic metal compounds of high thermal conductivity, such, for example, as aluminum oxide ($Al_2O_3$), aluminum nitride (AlN) powder, and silica ($SiO_2$) powder, are mixed into an epoxy resin or silicone resin and used.

At such time, moreover, for the filler powder and the resin material mixed together, highly insulative materials have been used for the purpose of preventing electronic component from short-circuiting.

However, there is a limitation in dramatically improving thermal conductivity by simply applying this type of mounting configurations wherein an inorganic filler is mixed. Furthermore, in order to improve cooling efficiency, it is necessary to use materials of high purity or the like, leading to problems of increased material costs.

Meanwhile, one of the main reasons for the necessity of using highly insulative materials as noted above, is as follows. When bonding is being effected, a bonding material that spreads out from the bonding area makes contact with other components, causing electronic components to be short-circuited. Thus, if only there were no such spreading out, it would often be possible to employ metallic bonding at the bonding site, whereupon one could expect a sharp improvement in cooling efficiency due to the sharp enhancement of the coefficient of thermal conductivity.

Such art is seen in Japanese Unexamined Patent Application Publication No. H8-227613/1996, wherein it is proposed that, by effecting heat treatment of a composition comprising material wherein a copper powder is coated with tin or similar metal, and a thermosetting polymer having a high curing temperature such as polyimide, the coating metal is melted, and mutual bonding thereof is effected.

In this invention, however, only a high-temperature process is disclosed as a specific process, where, for example, it is necessary to realize a temperature as high as the melting point (about 231° C.) or above of tin in order to melt tin used as a coating metal, while it is also necessary to effect heat treatment at 300 to 400° C. in order to cure the thermosetting resin. Accordingly, it is difficult therewith to avoid the problem of thermal damage to substrates, LSI's, and materials peripheral thereto.

Similar art is disclosed in Japanese Unexamined Patent Application Publication No. H10-265748/1998, wherein the art disclosed is for heat treating at 230° C.

In that invention also, however, it is necessary to heat to a temperature as high as the melting point or above of a coating metal in order to melt the coating metal, and there is little freedom to select a heat treatment temperature.

SUMMARY OF THE INVENTION

The present invention consists of a new conductive composition layer, new conductive particles and a new conductive composition that can be used in forming that layer, a new electronic device having that conductive composition layer between layers thereof, and a new forming method for the conductive composition layer.

Furthermore, because it is believed that the conductive composition layer according to the present invention, and the new conductive composition that can be used in forming that layer, will often be used as an adhesive layer or an adhesive composition, there are cases where, in the specification of this application, the terms conductive adhesive composition layer and conductive adhesive composition are used instead of conductive composition layer and conductive composition, respectively, but it goes without saying that the present invention also comprehends use in other fields where they are not used as an adhesive.

One aspect of the present invention consists in conductive particles comprising at least any two materials selected from the group consisting of Sn, Bi, In, and Pb, and alloys of any combinations of two or more thereof, the at least any two materials being in mutual contact.

That is, according to the present invention, when the metals or alloys noted above are made to come into mutual contact to form an adhesive composition layer or the like, a region or regions consisting of alloy are newly formed inside the composition layer at that heat treatment temperature, in order to exhibit conductivity.

Another aspect of the present invention is a conductive composition comprising the conductive particles noted above and a thermosetting resin having a curing temperature that is lower than 230° C. and/or a thermoplastic resin having a melting point that is lower than 230° C.

By combining the conductive particles noted above and a resin that can be processed at a comparatively low temperature such as described above, it becomes possible to form good conductive composition layers while avoiding, for example, the problem of thermal damage to substrates, LSI's, and materials peripheral thereto.

Yet another aspect of the present invention is a conductive composition layer having a region or regions of a metal or alloy having a melting point of 230° C. or higher, a region or regions of an alloy having a melting point that is lower than 230° C., and a region consisting of a thermoset resin and/or a thermoplastic resin, wherein at least one portion of the upper surface and one portion of the lower surface of that conductive composition layer are linked to each other by the region or regions of the alloy having a melting point lower than 230° C.

It became evident that the region or regions of the metal or alloy having a melting point of 230° C. or higher should be preferably configured from at least one material selected from the group consisting of Sn, Bi, and Pb, and that the region or regions of the alloy having a melting point that is lower than 230° C. should be preferably configured from an alloy formed by combining at least any two metals selected from the group consisting of Sn, Bi, In, and Pb.

In the present invention, moreover, when the term "thermoset resins" is used as in the foregoing, resins that have already been thermoset (thermally cured) are meant, but, at the same time, resins prior to completion of thermosetting are also connoted. In other words, there are cases where the term can represent intermediates of the curing reactions as well as thermosetting resins as starting materials for the curing reactions.

Not only does this conductive composition layer exhibit outstanding conductivity as a finally obtained conductive composition layer, but it also exhibits technically desirable effects during the stages where a conductive composition layer is being formed.

In other words, by having a region or regions of an alloy having a melting point that is lower than 230° C. as noted above, because the alloy is melting when the conductive composition layer is being heat-treated, for example, the bonding between portions of the alloy is better promoted, and alloy forming reactions with the region or regions of the metal or alloy having a melting point of 230° C. or higher are also promoted.

Furthermore, by having at least one portion of the upper surface and one portion of the lower surface of the conductive composition layer bound by the region or regions of the alloy having a melting point that is lower than 230° C., heat introduced from the outside is quickly transmitted to the interior of the conductive composition layer.

Furthermore, the region or regions of the metal or alloy having a melting point of 230° C. or higher can maintain a solid state in the conductive composition layer, and can oppose a reduction in the layer thickness of the conductive composition layer even when pressure is applied from the outside, wherefore the spreading out of the conductive composition to the outside can be prevented during die bonding or the like.

Hence, this conductive composition layer acts to promote the formation of the conductive composition layer itself.

Yet other aspects of the present invention pertain to a method of forming such a conductive composition layer, and to an electronic device having such a conductive composition layer between at least one combination of a semiconductor device and a cooling member, a semiconductor device and a substrate, and a lead terminal and a substrate.

DESCRIPTION OF THE PREFERRED EMBODIMENTS

Embodiments of the present invention are described below with reference to illustrations, drawings, tables, etc. However, the present invention is not limited by these illustrations, drawings, tables, or the like, and it goes without saying that other embodiments belong to the category of the present invention insofar as they agree with the gist of the present invention.

In the description which follows, moreover, thermosetting resins or thermoset resins are mainly taken as examples of the resin components used in compositions or composition layers. However, in the present invention, it is possible to use thermoplastic resins, either instead of the thermosetting resins or thermoset resins, or together with the thermosetting resins or thermoset resins. In such cases, the concept corresponding to the curing temperature of the thermosetting resin is melting point. More specifically, in the following description, when it is desirable that the curing temperature of a thermosetting resin be less than 230° C., for example, in the case of a thermoplastic resin, what is meant is that a melting point of less than 230° C. is desired.

Regarding the combinations of Sn, Bi, and In, in the respective binary system diagrams thereof, the eutectic point is 137° C. for Sn—Bi, and 117° C. for Sn—In. Regarding In combinations, it is 157° C. for In in a single phase, 117° C. for In—Sn, and 72° C. for In—Bi. Regarding Pb combinations, it is 183° C. for Pb—Sn and 125° C. for Pb—Bi.

Thus the metals according to the present invention often exhibit comparatively low eutectic points or melting points when in an alloyed state. By employing that characteristic, composition layers can be formed which have continuous regions of good conductivity, using respectively independent conductive particles.

This situation can be described by taking as an example a conductive composition consisting of an epoxy resin and conductive particles in which the surface of Sn as a base material is coated with Bi.

That is, when a composition prepared by mixing together an epoxy resin, and conductive particles having Sn as a base material and Bi for coating the surface of the base material, is heated to a temperature at or higher than 137° C. that is the eutectic point thereof, a eutectic reaction occurs at first in the vicinity of the interface between the Sn and Bi, and a liquid phase of an alloy consisting of Sn and Bi develops on the surface of the Sn base material.

In this case, in general, the formation of the liquid phase due to the generation of the alloy from the Sn and Bi will proceed faster than the curing of the epoxy resin, and, as a consequence, the curing of the resin will proceed successively after mutually bonded regions of good conductivity have been formed.

As a result, at the point in time when the epoxy resin has completely cured, the conductivity of the conductive composition described above will be manifested.

In other combinations such as In combinations or lead combinations, too, similar bonding processes will advance from a temperature at or above the respective eutectic points (solidus temperature). Accordingly, by appropriately changing the combination of these metals for alloy composition, it is possible to perform mounting at comparatively low curing temperatures up to 230° C.

Furthermore, although the eutectic point is used in the description given above, the alloys formed by the heat treatments according to the present invention are not limited to compositions having a eutectic point. Also, because the alloys formed by the heat treatment are gradually produced during the heat treatment, it is not as though the composition is always constant, and in some cases it will exhibit a concentration gradient.

In short, one of the characteristics of the present invention is that at least any two materials selected from the group consisting of Sn, Bi, In, and Pb, and alloys based on any combinations of two or more thereof, are caused to mutually contact each other to form an alloy that can be melted even at a comparatively low curing temperature below 230° C., with the result that regions of that alloy are used to impart conductivity to the composition. It is particularly preferable that the alloy be produced within a temperature range of 100 to 200° C.

In conjunction with this, the curing temperature of the thermosetting resin used in the composition should preferably be lower than 230° C., and the melting point of the thermoplastic resin used in the composition be lower than 230° C. It is more preferable that both of these temperatures be within a range of 100 to 200° C. When adhesive strength is considered, moreover, a thermosetting resin is preferable.

Examples of thermosetting resins or thermoset resins that can be used in the present invention include thermosetting resins or thermoset resins that are epoxy-based, phenolic-based, or acrylic-based, as well as thermosetting resins or thermoset resins that are polyimide-based, polyurethane-based, melamine-based, or urea-based.

Examples of epoxy thermosetting resins or thermoset resins that can be cited include bisphenol A type epoxy resins, bisphenol F type epoxy resins, (cresol) novolak type epoxy resins, halogenated bisphenol types, resorcin types, tetrahydroxyphenol ethane types, polyalcohol-polyglycol types, glycerin triether types, polyolefin types, epoxidized soybean oils, cyclopentadiene dioxide, and vinylcyclohexene dioxide, with bisphenol A type epoxy resins, bisphenol F type epoxy resins, and (cresol) novolak type epoxy resins being especially preferable.

Liquid epoxy compounds having one or more glycidyl groups in the molecule can be used. Examples of such compounds include phenoxyalkyl monoglycidyl ether, bisphenol A diglycidyl ether, propylene glycol diglycidyl ether, polypropylene glycol diglycidyl ether, hexanediol diglycidyl ether, hydrogenated bisphenol A diglycidyl ether, neopentyl glycol diglycidyl ether, glycerin diglycidyl ether, N,N-diglycidyl aniline, N,N-diglycidyl toluidine, trimethylol propane triglycidyl ether, glycerin triglycidyl ether, and various liquid polysiloxane diglycidyl ethers. Neopentyl glycol diglycidyl ether, glycerin diglycidyl ether, and trimethylol propane triglycidyl ether are especially preferable.

Ordinary epoxy curing agents can be used for the epoxy curing agent used in the present invention. There are, for example, fatty acid polyamine agents such as triethylene tetramine and m-xylene diamine, aromatic amine agents such as m-phenylene diamine and diaminodiphenyl sulfone, tertiary amine agents such as benzyldimethylamine and dimethylaminomethyl phenol, acid anhydride agents such as phthalic anhydride and hexahydrophthalic anhydride, and boron trifluoride amine complex agents such as $BF_3$-piperidine complex. Bisphenol compounds such as bisphenol A are also acceptable. Dicyandiamide, 2-ethyl-4-methylimidazole, and tris(methylamino)silane and the like can also be used. There are resin-based curing agents such as polyamide resins made from a linolenic acid dimer and ethylene diamine or the like, polysulfide resins having mercapto groups at both ends, and novolak-based phenol resins and the like. These can be used singly or in combinations of two or more.

The amount of a curing agent to be added differs according to the type of the curing agent. When there is a stoichiometric reaction with a glycidyl group, as in the case of an acid anhydride agent, for example, the optimal amount to add is determined from the epoxy equivalent. In cases where there is a catalytic reaction, 3 to 30% by weight is common. In the cases of curing agents that are highly reactive at room temperature, a liquid containing an initiator can be mixed with the resin immediately prior to use, or a curing agent can be made into a microcapsule by sealing it into a capsule of gelatin or the like having a size of 100 μm or so.

For thermoplastic resins used in the present invention, any thermoplastic resin whatever can be used, but polyethylene type, polyester type, polypropylene type, or acrylic type thermoplastic resins are especially preferable for use.

In some cases it will be preferable to have a hydrogen bonding functional group in the structure thereof. Functional groups exhibiting hydrogen bonding characteristics include hydroxyl group, amide group, urea group, imide group, ester group, ether group, thioether group, sulfone group, ketone group, etc. Examples of such thermoplastic resins that can be cited include phenoxy resins, thermoplastic polyurethanes, polyvinyl butyrals, polyamides, thermoplastic polyimides, polyamidimides, polycarbonates, polyphenylene ethers, polyvinyl ethers, polysulfones, polyvinyl alcohols, polyvinyl formals, polyvinyl acetates, methacrylic resins, ionomer resins, etc. The reason why thermoplastic resins having hydrogen bonding functional groups are particularly outstanding is not known for sure, but is thought to be due to improved wetting resulting from hydrogen bonding with the metals.

It is also possible to use a thermosetting resin or thermoset resin noted above together with a thermoplastic resin. Various kinds of additives can also be added into these resins to improve their mechanical, physical, or chemical properties, examples thereof including curing promoters, flame retardants, leveling agents, thixotropy imparting agents, anti-settling agents, coupling agents, monoepoxy compounds, pigments, anti-foaming agents, corrosion inhibitors, viscosity imparting agents or thickeners, and fibrous or granular inorganic reinforcing fillers.

Also, because viscosity during use is an important factor, it is possible, in order to adjust the viscosity, to mix in an appropriate amount of a monoepoxy compound or a solvent such, for example, as dimethyl formamide, dimethyl acetamide, N-methyl-pyrrolidone, methylethyl ketone, methyl cellosolve, methyl carbitol, carbitol, carbitol acetate, butyl cellosolve acetate, ethyl cellosolve acetate, methyl cellosolve acetate, butyl cellosolve, ethyl cellosolve, and methyl cellosolve, used either singly or as a mixture of a plurality thereof. In the interest of workability, the viscosity of the solution or paste material obtained should be 5000 to 400,000 cp., and preferably 20,000 to 70,000 cp.

The mixing of the resin and the conductive particles according to the present invention can be done by means of a known method using any of various kneading machines such as a ball mill, roll mill, or planetary mixer, performing the kneading of various components for 10 to 60 minutes, for example. The kneaded conductive composition can be coated on by a process such as screen printing, dispenser coating, or the like.

In the foregoing description, cases where a plurality of metals is used are exemplified, but cases where those metals are alloys are also comprehended in the category of the present invention so long as an alloy at a comparatively low temperature within the range noted earlier is produced.

Also, although conductive particles the base material whereof has been coated with another metal have been described, the present invention is not necessarily limited to such a coating, but what is important is that those metals be in mutual contact, in order to make it easy to produce an alloy of a plurality of metals. Nevertheless, having a coating such as described earlier is to be preferred.

Furthermore, among those combinations, the brittleness of Bi may cause concern in the cases of compositions wherein the mixture ratio of Bi is great. However, because the bonding strengths of the compositions according to the present invention have an advantageous effect, problems with brittleness do not readily arise.

There is no particular limitation to the shape of the conductive particles, and such shapes as spherical, flat, and fibrous are conceivable. What are ordinarily called metal fillers can be used for this purpose.

The average particle size of the conductive particles should be about the same as that of commonly known filler powders used for the purpose of enhancing conductivity, with a range of 5 to 40 μm, for example, being desirable. By "average particle size" in the specification of this application is meant the "sphere-converted average particle diameter," representing a diameter wherein these particles are converted to spheres, and the diameter is calculated from the cubic volume of the spheres.

Furthermore, it is easy for a eutectic reaction to occur and to produce a liquid phase when the material forming the surface phase (coating layer) on the base material (Sn, In, and/or Pb), that is, the coating of the coated particles, is secured at a film thickness corresponding to 5% or greater of the average particle size of the base material. A range of 0.5 to 4 μm is optimal for the film thickness. This film thickness is an average value that can be found by computation from the surface area of the particles prior to coating and the cubic volume of the coated particles.

The reasons for the limitation to 5% or greater is that otherwise there will be more cases where the plating film will not fuse due to the influence of an oxidized surface film, mutual bonding is not obtained in the filler powder after the epoxy thermosetting resin has been cured, and therefore, a highly conductive bonding form cannot be expected.

When the film thickness is made 15% or greater, moreover, chances of the base material being completely fused will be high and a good bonding portion is formed. On the other hand, however, there are also cases where the value of the coefficient of thermal conductivity will be higher for an alloy form. Accordingly, in many cases, it will be preferable for the thickness of the plating film to be 15% or less.

Next, it is preferable that 10 to 100 parts by weight of the thermosetting resin and/or thermoplastic resin be contained, based on 100 parts by weight of the conductive particles. When 100 parts by weight is exceeded, it may sometimes happen that the metal powder settles out, paths in the form of metal bonding for the transmission of electricity and/or heat from the lower end to the upper end of the composition layer will not be obtained, and therefore, adequate conductivity will not be obtained. At less than 10 parts by weight, on the other hand, due to a rise in viscosity, it may sometimes happen that kneading or defoaming workability will decline, that the probability of metal portions being exposed will become high, and that much spreading out of the resin will occur when the resin is cured.

The conductive particles used in the present invention can be manufactured by a variety of methods. They may be easily manufactured, for example, by forming a coating material layer on the base material surface by wet plating or by a dry plating process such as vacuum vapor deposition.

Examples of the present invention are now described with reference to FIGS. 1 to 8.

Figure 1:
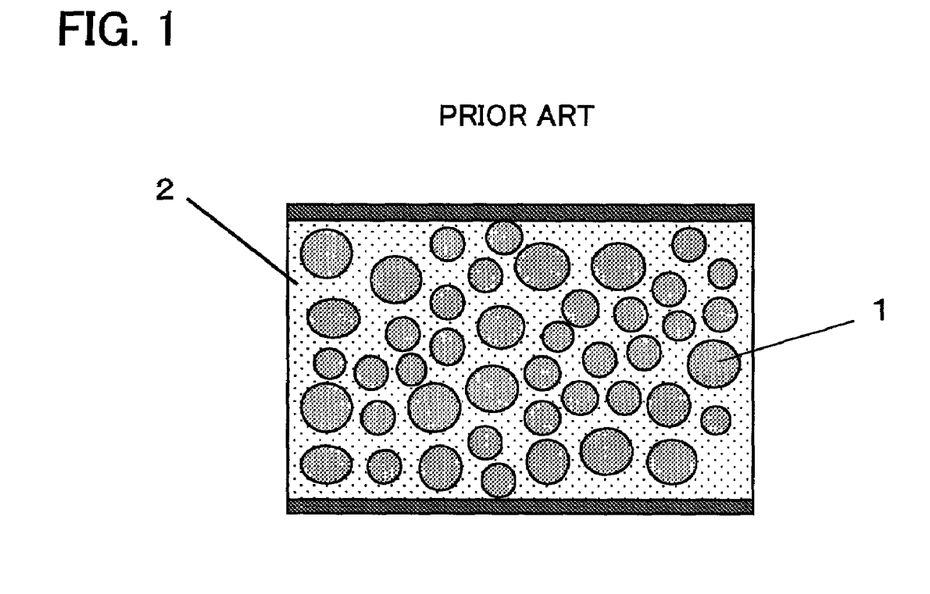
FIG. 1 is a cross-sectional view of a conventional conductive composition layer wherein an inorganic filler is dispersed in a thermoset resin.

FIG. 1 represents a cross-sectional view of a conventional conductive composition layer wherein an inorganic filler 1 such as AlN or $Al_2O_3$ is dispersed in a thermoset resin 2 such as an epoxy resin.

In this case, because the contact between the inorganic filler particles themselves is inadequate, it is difficult to achieve any sharp improvement in thermal conductivity.

Figure 2:
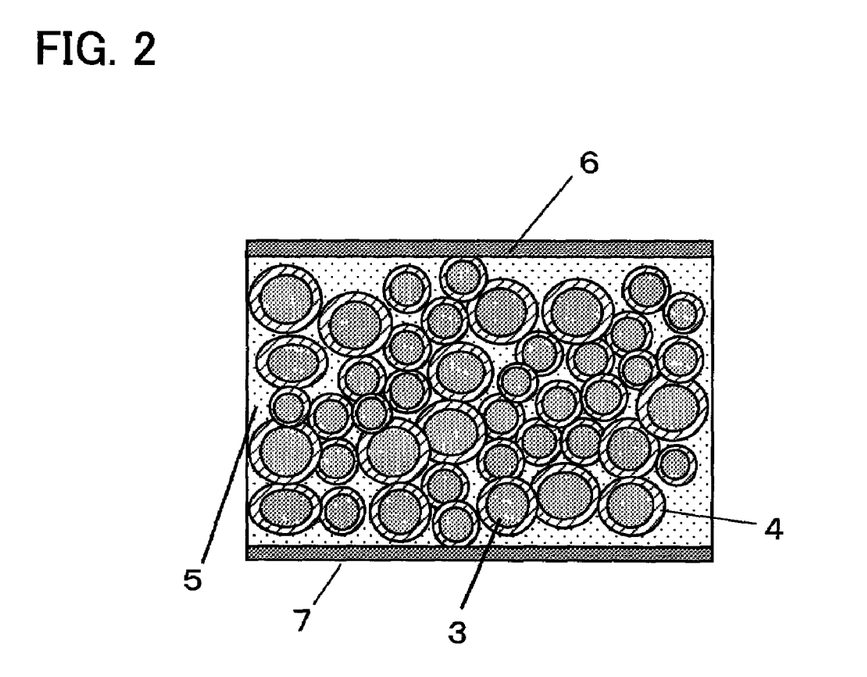
FIG. 2 is a cross-sectional view showing a state wherein a composition comprising a resin as well as dispersed conductive particles made of a metal base material and a metal layer coating the base material is sandwiched between two flat members.

FIG. 2 is a cross-sectional view showing a state wherein a composition comprising a resin 5 as well as conductive particles according to the present invention that are made of a metal base material 3 and a metal layer 4 coating the base material dispersed in the resin 5 is sandwiched between two flat members of an upper layer 6 and a lower layer 7. That is, in this example, the mutual contact between two metals is achieved by a configuration wherein one metal is coated onto the other metal.

For the resin 5, as noted earlier, a thermosetting resin having a thermosetting temperature lower than 230° C. and/or a thermoplastic resin having a melting point lower than 230° C. is preferred.

In FIG. 2, portions of the metal are in mutual contact in the sea of resin, and some degree of improvement in the coefficient of thermal conductivity, as compared to the resin alone, is observed. At this stage, however, the alloy regions of mutual bonding described subsequently have not been produced.

Figure 3:
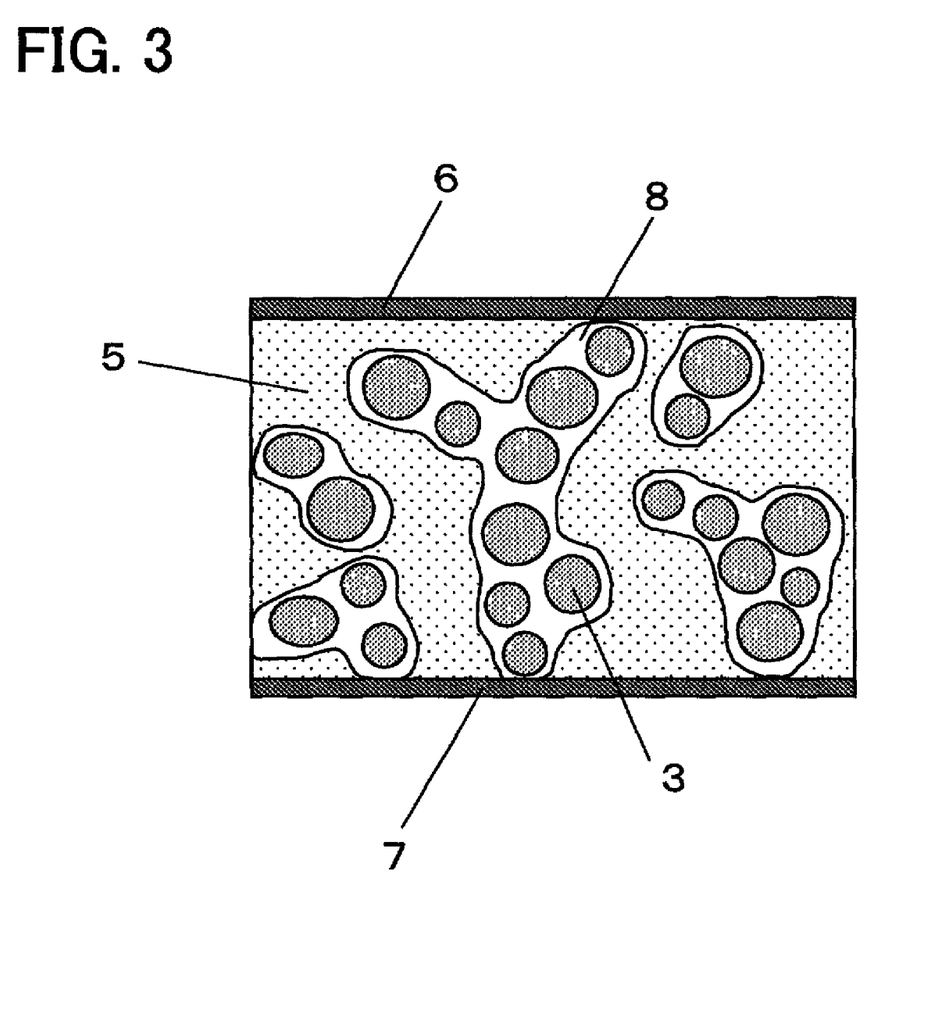
FIG. 3 represents the results of heating the composition diagrammed in FIG. 2.

FIG. 3 represents a situation where the composition of FIG. 2 has been heated, the metal base material 3 and the metal layer 4 have produced an alloy, and the alloy has fused whereby mutual bonding occurs, an alloy region 8 having a network structure is produced, and the upper layer 6 and the lower layer 7 are connected by the alloy region 8.

Regarding such a structure as this, when a conductive composition layer having regions of metal or alloy having a melting point of 230° C. or higher, regions of alloy having a melting point lower than 230° C., and a region comprising a thermoset resin and/or a thermoplastic resin, wherein at least a portion of the upper surface and a portion of the lower surface of that conductive composition is bonded together by those regions of alloy having a melting point less than 230° C., is formed during the fabrication of the conductive composition layer, the coefficient of thermal conductivity is improved, heat applied from the outside is transmitted more quickly to the interior of the composition layer, and, thereby, the alloy producing reactions and resin curing reactions are promoted, and it becomes possible to improve the coefficient of thermal conductivity of the composition layer in the final product.

In the heating process noted above, moreover, the composition layer will usually not exhibit good conductivity initially, but will come to exhibit good conductivity finally due to the production of the alloy regions described in the foregoing. Accordingly, it will be useful to determine the process conditions by trial and error so that the composition layer will exhibit good conductivity at the time that the heat treatment noted above is finished.

In the interest of producing a low melting temperature alloy, moreover, it is preferable that this metal base material 3 be configured of at least one material selected from the group consisting of Sn, Bi, and Pb, and that the alloy region 8 be configured of an alloy resulting from the combination of at least any two metals selected from the group consisting of Sn, Bi, In, and Pb.

When a thermosetting resin having a curing temperature lower than 230° C. and/or a thermoplastic resin having a melting point lower than 230° C. is used for the resin, it is preferable that the heating noted earlier be done at a temperature that is lower than 230° C. The reason therefor is so that a composition layer exhibiting adequate bonding strength and thermal conductivity can be realized without thermally damaging nearby devices or elements or the like.

Figure 4:
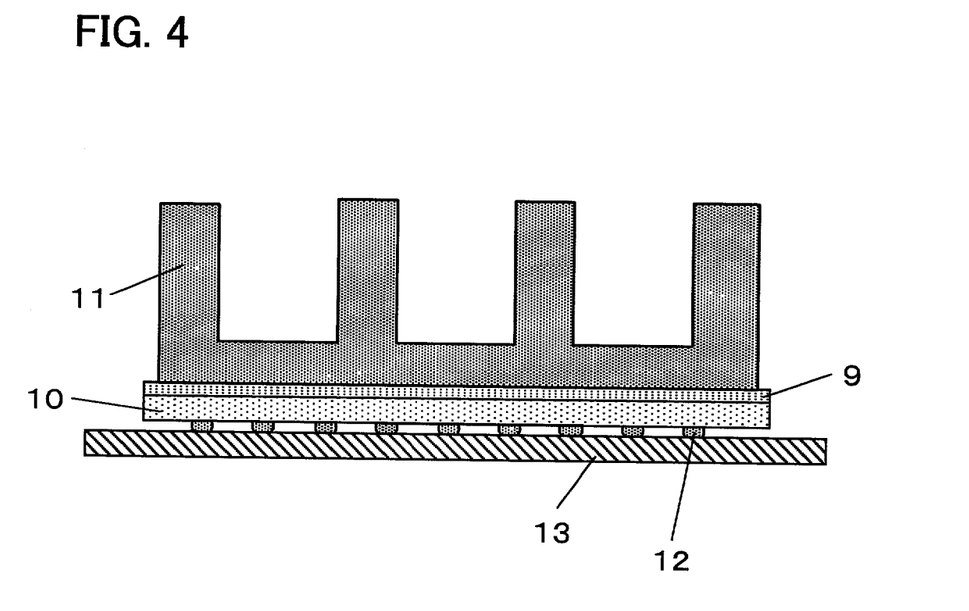
FIG. 4 represents a cross-sectional view in a case where a conductive composition layer is sandwiched between a semiconductor device and a cooling member.

FIG. 4 is a cross-sectional view of a case where a conductive composition layer 9 according to the present invention is sandwiched between a semiconductor device 10 and a cooling member (heat sink) 11. The semiconductor device 10 is electrically connected to a circuit board 13 through solder bumps 12.

Based on such a structure as this and the structure diagrammed in FIG. 3, heat generated in the semiconductor device 10 is quickly transferred to the heat sink 11 and there released into the air.

Figure 5:
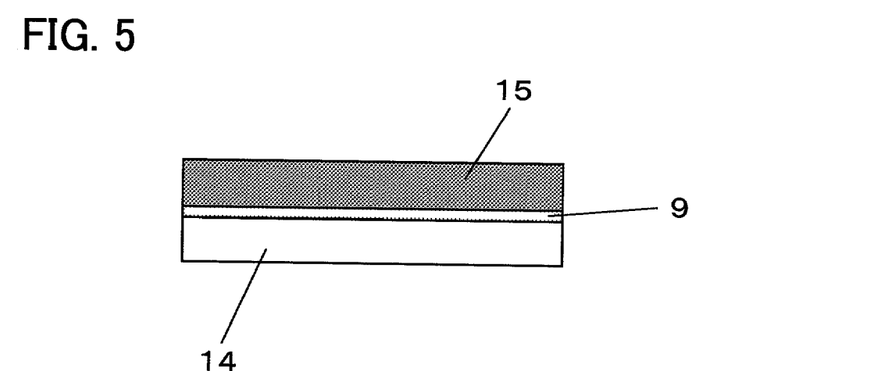
FIG. 5 represents a cross-sectional view in a case where a conductive composition layer is sandwiched between an LSI and a cooling member.

FIG. 5 is a cross-sectional view of a case where the conductive composition layer 9 according to the present invention is sandwiched between an LSI 14 and a cooling member (heat spreader) 15.

Based on such a structure as this and the structure diagrammed in FIG. 3, the heat generated in the LSI 14 is transferred to the heat spreader 15 and there radiated into the air.

The present invention, moreover, can be employed even in applications where electrical conductivity is needed and not thermal conductivity to seek thermal conductivity by metals and alloys, as already noted.

Figure 6:
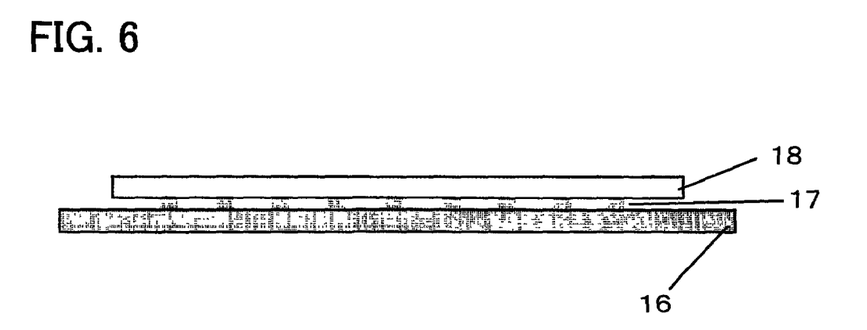
FIG. 6 is a cross-sectional view showing how a circuit board and an LSI are electrically connected by solder bumps consisting of a conductive composition.
Figure 7:
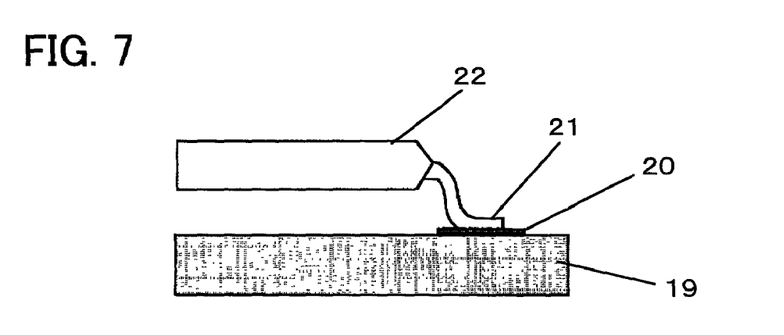
FIG. 7 is a cross-sectional view showing how a circuit board and a QFP lead terminal are electrically connected by a conductive composition layer.
Figure 8:
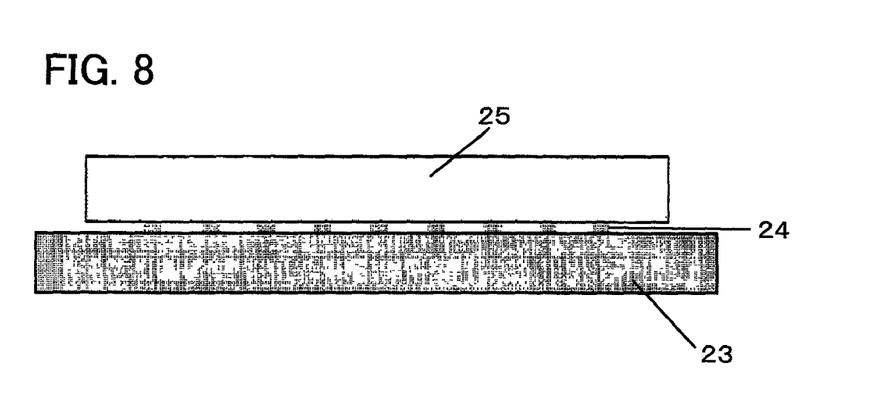
FIG. 8 is a cross-sectional view showing how a mother board and a CSP are electrically connected by solder balls consisting of a conductive composition.

Examples thereof are diagrammed in FIGS. 6 to 8.

FIG. 6 is a cross-sectional view representing how a circuit board 16 and an LSI 18 are electrically connected by solder bumps 17 consisting of a conductive composition according to the present invention.

FIG. 7 is a cross-sectional view representing how a lead terminal 21 of a QFP (quad flat package) 22 is electrically connected to a circuit board 19 by a conductive composition layer 20 according to the present invention.

FIG. 8 is a cross-sectional view representing how a motherboard 23 and a CSP (chip size package) 25 are electrically connected by solder balls 24 consisting of a conductive composition according to the present invention.

EXAMPLES

Examples of the present invention and comparative examples are described next. However, the present invention is not limited to or by these.

Example 1

On Sn powder base materials having an average particle size of 20 to 40 μm (made by Mitsui Mining and Smelting Co., Ltd.), were formed Bi and In to film thicknesses of approximately 2 to 4 μm by electroplating, respectively, to fabricate metal fillers.

Those metal fillers (90 to 60% by weight) were then mixed and stirred together with EXA 830 LVP (10 to 40% by weight) which is a bisphenol A type epoxy resin made by Dainippon Ink and Chemicals, Inc., and the resin mixtures were cured under conditions of either 170° C. for 5 minutes or 150° C. for 30 minutes.

The coefficients of thermal conductivity were measured by a laser flash method. The measured results are given in Table 1.

Example 2

On In powder base materials having an average particle size of 20 to 40 μm, were formed Sn and Sn—Bi alloy to film thicknesses of approximately 2 to 4 μm by electroplating, respectively, to fabricate metal fillers.

Those metal fillers (80% by weight) were then mixed and stirred together with EXA 830 LVP (20% by weight) which is a bisphenol A type epoxy resin made by Dainippon Ink and Chemicals, Inc., and the resin mixtures were cured under conditions of 150° C. for 30 minutes.

The coefficients of thermal conductivity were measured by a laser flash method. The measured results are given in Table 1.

Example 3

On Pb powder base materials having an average particle size of 20 to 40 μm, were formed Sn—Bi alloys and Sn—In alloys to film thicknesses of approximately 2 to 4 μm by electrolessplating, respectively, to fabricate metal fillers.

Those metal fillers (80% by weight) were then mixed and stirred together with EXA 830 LVP (20% by weight) which is a bisphenol A type epoxy resin made by Dainippon Ink and Chemicals, Inc., and the resin mixtures were cured under conditions of 150° C. for 30 minutes.

The coefficients of thermal conductivity were measured by a laser flash method. The measured results are given in Table 1.

Comparative Example 1

With 30 to 40% by weight of EXA 830 LVP, which is a bisphenol A type epoxy resin made by Dainippon Ink and Chemicals, Inc., were mixed aluminum nitride powders at concentrations of 70 to 60% by weight, and the resin mixtures were cured under conditions of 170° C. for 5 minutes. The coefficients of thermal conductivity were measured similarly by a laser flash method.

According to the results, as indicated in Table 1, with the present invention, by using a metal powder as a filler, a coefficient of thermal conductivity of 1.8 to 12 W/m·K could be secured in Sn (base material)-Bi, or In (coating material) combinations, and a coefficient of thermal conductivity of 9.6 to 12.5 W/m·K could be secured in Pb or In (base material)-Sn, Bi, or Sn—Bi (coating material) combinations. Thus it was possible therewith to obtain a bonding material having higher cooling efficiency than bonding compositions wherein a conventional inorganic filler is mixed in.

Bonding materials based on these resins and filler compositions are also used as highly thermally conductive materials, but it is conceivable too that they will function also as electroconductive compositions from the fact that metal bonding can be secured and an electrical path obtained.

TABLE 1

Coefficient of Thermal Conductivity in Resin/Filler Compositions Under Various Curing Conditions

|  | SampleNo. | Base material/coating material mixture | Filler/resin mixing ratio | Curing conditions | Coefficient of thermal conductivity (W/m · K) of bonding material after curing |
|---|---|---|---|---|---|
| Example 1 | Sn—Bi-1 | Sn/Bi | 60/40 | 170° C.–5分 | 1.8 |
|  | Sn—Bi-2 | Sn/Bi | 70/30 | 170° C.–5分 | 2.5 |
|  | Sn—Bi-3 | Sn/Bi | 80/20 | 170° C.–5分 | 9.2 |
|  | Sn—Bi-4 | Sn/Bi | 90/10 | 170° C.–5分 | 10 |
|  | Sn—In | Sn/In | 90/10 | 150° C.–30分 | 12 |
|  | Sn—In—Bi | Sn/In—Bi | 80/20 | 150° C.–30分 | 9.5 |
| Example 2 | In—Sn | In/Sn | 80/20 | 150° C.–30分 | 12 |
|  | In—Sn—Bi | In/Sn—Bi | 80/20 | 150° C.–30分 | 9.8 |
| Example 3 | Pb—Bi | Pb/Bi | 80/20 | 150° C.–30分 | 9.6 |
|  | Pb—Sn—Bi | Pb/Sn—Bi | 80/20 | 150° C.–30分 | 11.7 |
|  | Pb—Sn—In | Pb/Sn—In | 80/20 | 150° C.–30分 | 12.5 |
| Comparative example |  | AlN | 70/30 | 170° C.–5分 | 2.2 |
|  |  | AlN | 60/40 | 170° C.–5分 | 1.5 |

By forming a resin layer using a mixture composition of a filler powder and a resin according to the present invention and performing a low-temperature processing, a resin layer exhibiting adequate conductive characteristics can be formed.

In an electronic device comprising electronic components such as LSI devices and circuit boards, moreover, high cooling efficiency can be obtained, when bonding is effected between the cooling members and electronic components by forming this resin layer between the cooling members and the electronic components.

Based on the present invention, furthermore, a resin layer exhibiting adequate electrical conductivity can be formed.

What is claimed is:

1. A conductive composition, comprising:
   conductive particles consisting of a base material and a coating material, respectively,
   said coating material being provided on said base material such that said coating material and said base material are in mutual contact,
   said base material comprising one or more members selected from the group consisting of Sn, Bi, In, Pb, and alloys thereof, and
   said coating material comprising one or more members selected from the group consisting of Sn, Bi, In, Pb, and alloys thereof; and
   a resin composition comprising one or more members selected from the group consisting of a thermosetting resin having a curing temperature lower than 230° C. and a thermoplastic resin having a melting point lower than 230° C., wherein the resin composition cures and/or solidifies after a heating treatment at a temperature lower than 230° C. to act as an adhesive material, wherein said resin composition comprises at least one member selected from the group consisting of: epoxy-based thermosetting resins, phenolic-based thermosetting resins, acrylic-based thermosetting resins, polyethylene type thermoplastic resins, polyester type thermoplastic resins, polypropylene type thermoplastic resins, and acrylic type thermoplastic resins.

2. The conductive composition of claim 1, wherein said curing temperature and/or said melting point, are in the range of from 100° C. to 200° C.

3. The conductive composition of claim 1, wherein said resin composition comprises 10 to 100 parts by weight based on 100 parts by weight of said conductive particles.

4. The conductive composition of claim 3, wherein said resin composition comprises 10 to 40 parts by weight based on 100 parts by weight of said conductive particles.

5. The conductive composition of claim 1, wherein said at least two materials comprise at least one base material and at least one coating material, where said coating material is provided on said base material to form a coating.

6. The conductive composition of claim 5, wherein said coating material has a film thickness corresponding to 5% or greater of the average particle size of the base material.

7. The conductive composition of claim 5, wherein said coating material has a film thickness of from 0.5 μm to 4.0 μm.

* * * * *